(12) United States Patent　(10) Patent No.: US 7,238,996 B2
Kimizuka et al.　(45) Date of Patent: Jul. 3, 2007

(54) SEMICONDUCTOR DEVICE

(75) Inventors: Naohiko Kimizuka, Kanagawa (JP); Kiyotaka Imai, Kanagawa (JP); Yuri Masuoka, Kanagawa (JP); Toshiyuki Iwamoto, Tokyo (JP); Motofumi Saitoh, Tokyo (JP); Hirohito Watanabe, Tokyo (JP); Ayuka Tada, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/129,439

(22) Filed: May 16, 2005

(65) Prior Publication Data

US 2005/0263802 A1　Dec. 1, 2005

(30) Foreign Application Priority Data

May 25, 2004　(JP)　............................. 2004-154268

(51) Int. Cl.
*H01L 29/70* (2006.01)
(52) U.S. Cl. ............................... 257/406; 257/E21.639
(58) Field of Classification Search ................ 257/406, 257/E21.639
See application file for complete search history.

(56) References Cited

U.S. PATENT DOCUMENTS 7,023,064 B2 * 4/2006 Park et al. ................... 257/412

2003/0201505 A1 * 10/2003 Kurata ........................ 257/412
2005/0224897 A1 * 10/2005 Chen et al. .................. 257/410

FOREIGN PATENT DOCUMENTS

| JP | 2002-280461 | 9/2002 |
|---|---|---|
| JP | 2004-103737 | 4/2004 |
| JP | 2004-214376 | 7/2004 |
| JP | 2005-217272 | 8/2005 |

OTHER PUBLICATIONS

C Hobbs et al., "Fermi Level Pinning at the PolySi/Metal Oxide Interface", 2003 Symposium on VLSI Technology Digest of Technical Papers, 4-89114-0335-6/03, APRDL, Digital DNA Laboratories, Motorola, Austin, TX.

* cited by examiner

*Primary Examiner*—B. William Baumeister
*Assistant Examiner*—Amar Movva
(74) *Attorney, Agent, or Firm*—Young & Thompson

(57) ABSTRACT

A semiconductor device 100 comprises a silicon substrate 102, an N-type MOSFET 118 including a high concentration-high dielectric constant film 108b formed on the silicon substrate 102 and a polycrystalline silicon film 114, and a P-type MOSFET 120 including a low concentration-high dielectric constant film 108a and a polycrystalline silicon film 114 formed on the semiconductor substrate 102 to be juxtaposed to the N-type MOSFET 118. The low concentration-high dielectric constant film 108a and the high concentration-high dielectric constant film 108b are composed of a material containing one or more element (s) selected from a group consisting of Hf and Zr. The concentration of the above-described metallic element contained in the low concentration-high dielectric constant film 108a is lower than that contained in the high concentration-high dielectric constant film 108b.

10 Claims, 6 Drawing Sheets

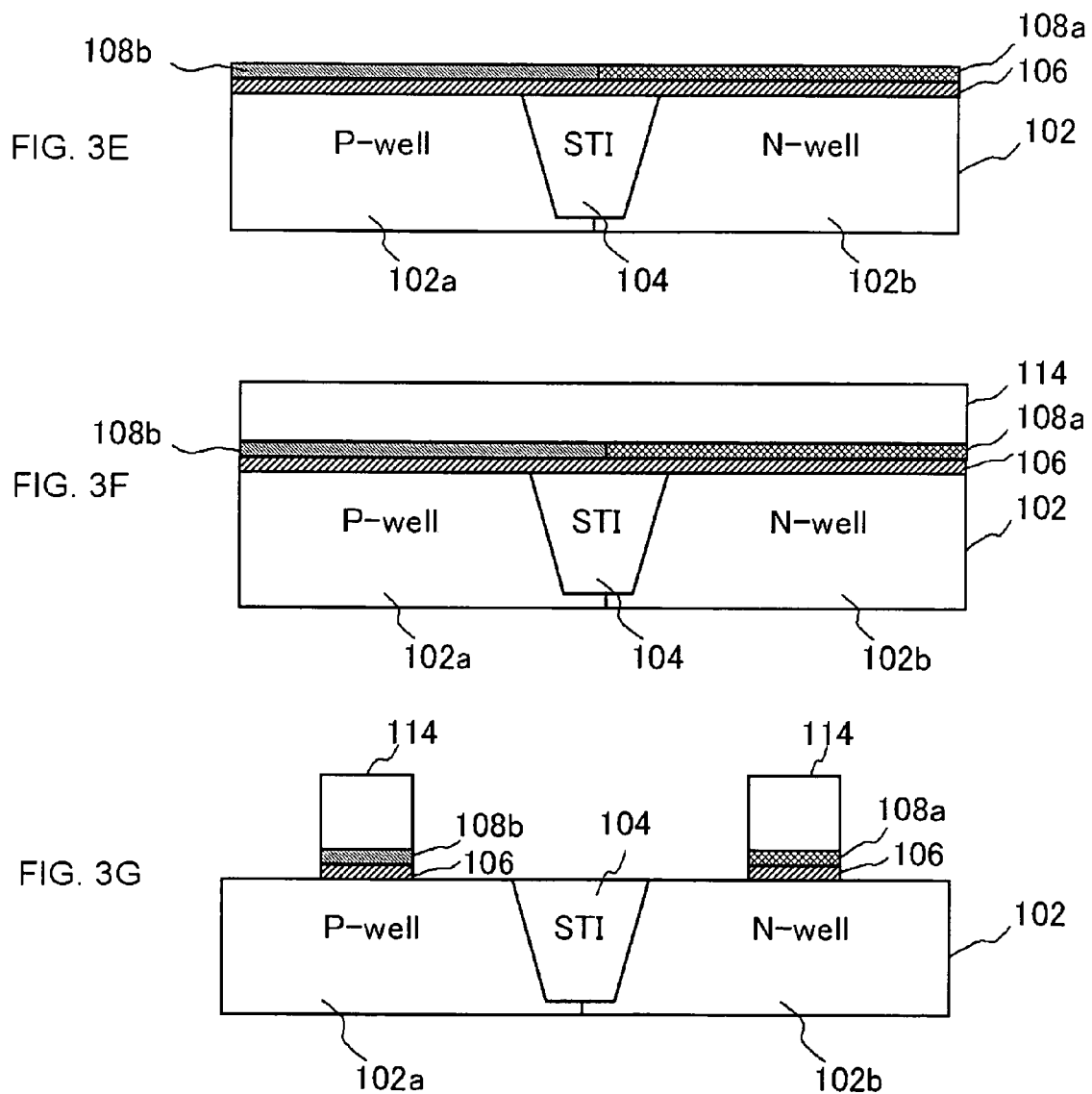

US 7,238,996 B2

SEMICONDUCTOR DEVICE

This application is based on Japanese patent application No. 2004-154268, the content of which is incorporated hereinto by reference.

BACKGROUND OF THE INVENTION

1. Field of the Invention

The present invention relates to a semiconductor device comprising an N-type metal oxide semiconductor field effect transistor (MOSFET) and a P-type MOSFET both containing high dielectric constant films.

2. Related Art

In recent years, the utilization of a thin film having high dielectric constant called high-k as a component material for the semiconductor devices is actively investigated. Typical high-k material includes oxides of elements such as Zr, Hf and the like. The use of such materials for a gate insulating film of a metal oxide semiconductor field effect transistor (MOSFET) reduces a silicon oxide-conversion electrical thickness, even though the physical thickness of the gate insulating film is increased to a certain level, thereby providing a physically and structurally stable gate insulating film. Thus, both or either one of an increase of metal oxide semiconductor (MOS) capacity for enhancing characteristics of MOSFET and a reduction of gate leakage current as compared with a conventional case of employing silicon oxide can be achieved.

Japanese Laid-open patent publication No. 2002-280,461 discloses a complementary metal oxide semiconductor (CMOS) device including an N-type MOSFET and a P-type MOSFET employing such high-k material. The N-type MOSFET and the P-type MOSFET include a gate insulating film composed of a low dielectric constant film such as silicon oxide film and the like and a high dielectric constant film, and a gate electrode composed of a polycrystalline silicon or the like. The gate electrode is disposed so as to contact with the high dielectric constant film of the gate insulating film.

However, a comprehension is obtained according to the recent study, in which a phenomenon called Fermi level pinning is caused when the gate insulating film is composed of a high-k film and the gate electrode is composed of a polycrystalline silicon (C. Hobbs et al., entitled "Fermi Level Pinning at the PolySi/Metal Oxide Interface", 2003 Symposium on VLSI Technology Digest of Technical Papers). It is considered that Fermi level pinning is caused when an energy level is created on the basis of chemical bonding of silicon with the above-described metal for composing the high-dielectric constant film being diffused through the polycrystalline silicon that composes the gate electrode, in vicinity of an interface on the side of the gate insulating film in the gate electrode.

When the metal composing the high dielectric constant film is diffused into the polycrystalline silicon of the gate electrode of the MOSFET, a depletion layer is created in the polycrystalline silicon in vicinity of an interface thereof with the gate insulating film. Fermi level pinning is occurred due to an influence of such depletion layer, and thus sufficient electrical field cannot be applied to the gate insulating film even though a gate voltage is applied, and eventually it becomes difficult to induce enough amount of carrier in the channel region. As a result, a problem is arisen, in which a threshold voltage is increased, and further a fluctuation in the threshold voltage is also increased.

Such Fermi level pinning is easy to be occurred in a P-type MOSFET that includes a gate electrode composed of a polycrystalline silicon containing a P-type impurity, in particular in a case of employing Hf and/or Zr for the high dielectric constant film.

In the meantime, high dielectric constant films having same composition and same film thickness are employed for gate insulating films of the N-type MOSFET and the P-type MOSFET, which respectively constitute internal circuits of LSI in conventional CMOS devices.

In order to improve the MOSFET characteristics by increasing the dielectric constant of the high dielectric constant film, it is preferable to have higher concentration of the metal such as Hf or Zr.

On the other hand, a threshold voltage for a P-type MOSFET employing a high dielectric constant film containing a specific element such as Hf, Zr and the like is increased, since a diffusion of a metal such as Hf or Zr causes Fermi level pinning in the P-type MOSFET as described above, and is eventually increased to a level that provides a difficult situation in establishing a desired threshold voltage by adjusting density of an impurity in the Si substrate.

SUMMARY OF THE INVENTION

The present inventors have found in the process of examining measures to the above-described problem that a quantity of an increase of the threshold voltage is dependent on a concentration of a specified element in the high dielectric constant film. In addition, the present inventors also have found that the reason for causing the above-described problem is not from an increase of the MOS capacity caused by the reduction of the thickness of the high dielectric constant film, but from a fact that a quantity of a specific element originally contained in the high dielectric constant film diffusing from the high dielectric constant film into the gate electrode is dependent on the concentration of the specified element in the high dielectric constant film, and thereby being attained to invent the present invention.

According to the present invention, there is provided a semiconductor device, comprising: a semiconductor substrate; an N-type MOSFET including: a first gate insulating film, formed on the semiconductor substrate, and composed of a first high dielectric constant film including one or more metallic element(s) selected from a group consisting of Hf and Zr; and a first gate electrode, disposed on the first gate insulating film to contact with the first high dielectric constant film, and composed of a polycrystalline silicon film; and a P-type MOSFET including:

a second gate insulating film, formed on the semiconductor substrate to be juxtaposed to the N-type MOSFET, and composed of a second high dielectric constant film containing one or more metallic element (s) selected from a group consisting of Hf and Zr; and a second gate electrode, disposed on the second gate insulating film to contact with the second high dielectric constant film, and composed of a polycrystalline silicon film, wherein a concentration of the metallic element in the second high dielectric constant film is lower than a concentration of the metallic element in the first high dielectric constant film.

According to one aspect of the present invention, there is provided a semiconductor device, comprising: a semiconductor substrate; an N-type MOSFET including: a first gate insulating film, formed on the semiconductor substrate, and composed of a first high dielectric constant film including one or more metallic element (s) selected from a group consisting of Hf and Zr; and a first gate electrode, disposed on the first gate insulating film to contact with the first high dielectric constant film, and composed of a polycrystalline silicon film; and a P-type MOSFET including: a second gate insulating film, formed on the semiconductor substrate to be juxtaposed to the N-type MOSFET, and composed of a second high dielectric constant film containing one or more metallic element(s) selected from a group consisting of Hf and Zr; and a second gate electrode, disposed on the second gate insulating film to contact with the second high dielectric constant film, and composed of a polycrystalline silicon film, wherein a concentration of the metallic element at least at an interface contacting with the polycrystalline silicon film in the second high dielectric constant film is lower than a concentration of the metallic element at an interface contacting with the polycrystalline silicon film in the first high dielectric constant film.

The disclosure of C. Hobbs et al., entitled "Fermi Level Pinning at the PolySi/Metal Oxide Interface", 2003 Symposium on VLSI Technology Digest of Technical Papers describes that Fermi level pinning is caused when a high-k film such as $HfO_2$ and the like is provided so as to contact with a polycrystalline silicon. Such Fermi level pinning is considerably influential on the operation of the P-type MOSFET. In particular, the influence on the P-type MOSFET becomes larger when the P-type MOSFET includes the high dielectric constant film containing Hf such as $HfO_2$ and HfAlO. However, since the concentration of the metallic element is set to be lower at the interface where the second high dielectric constant film of the P-type MOSFET contacts with the polycrystalline silicon film in the present invention, the diffused quantity of the metal element, which has been originally contained in the second high dielectric constant film and is diffused into the polycrystalline silicon film, is reduced, even though the second high dielectric constant film contacts with the polycrystalline silicon film, and thus the generation of the depletion layer in the polycrystalline silicon can be avoided. This can diminish the influence of Fermi level pinning on the P-type MOSFET. Therefore, the increase of the threshold voltage of the P-type MOSFET can be reduced and the fluctuation thereof can also be decreased.

In addition, the dielectric constant of the first high dielectric constant film can be increased by forming the first high dielectric constant film in the N-type MOSFET to have higher concentration of the metallic element, thereby improving the MOSFET characteristic of the N-type MOSFET.

Although it is not intended to particularly limit the scope of the invention, the first high dielectric constant film and the second high dielectric constant film may be typically formed to have substantially the same film thickness. Since the concentration of the metallic element at the interface of the second high dielectric constant film with the polycrystalline silicon film is lower according to the present invention as have been described above, the generation of Fermi level pinning in the P-type MOSFET can be prevented, even if the film thicknesses of the first high dielectric constant film and the second high dielectric constant film are increased to a level, which provides sufficiently lower gate leakage current that will not cause a problem, thereby stably reducing the threshold voltage of the P-type MOSFET.

In the semiconductor device according to the present invention, the first high dielectric constant film and the second high dielectric constant film may contain Hf and Si. The content ratio of Hf for the total content of Hf and Si may be equal to or higher than 20 atomic % in the first high dielectric constant film and the second high dielectric constant film. More preferably, the content ratio of Hf over the total content of Hf and Si may be equal to or higher than 30 atomic %. In the semiconductor device according to the present invention, the first high dielectric constant film and the second high dielectric constant film are respectively and independently composed of HfSiO or HfAlO, or nitride thereof. In such case, a lower limit of the percentage of Hf over the total content of Hf and Al in HfAlO may be equal to or higher than 20 atomic %. Further, the semiconductor devices may have a configuration, in which the first high dielectric constant film and the second high dielectric constant film are free of Al.

The influence of Fermi level pinning over the P-type MOSFET may be a problem when it contains such the metallic elements. On the contrary, since the concentration of the metallic element is lower in the formed second high dielectric constant film of the P-type MOSFET in the present invention, the influence of Fermi level pinning over the operation of the P-type MOSFET can be diminished, as described above.

The semiconductor devices according to the above-described aspects of the present invention may further have a configuration, in which an average concentration of the metallic element in the second high dielectric constant film is lower than an average concentration of the metallic element in the first high dielectric constant film.

According to further aspect of the present invention, there is provided a semiconductor device, comprising: a semiconductor substrate; an N-type MOSFET including: a first gate insulating film, formed on the semiconductor substrate, and composed of a first high dielectric constant film including one or more metallic element (s) selected from a group consisting of Hf and Zr; and a first gate electrode, disposed on the first gate insulating film to contact with the first high dielectric constant film, and composed of a polycrystalline silicon film; and a P-type MOSFET including: a second gate insulating film, formed on the semiconductor substrate to be juxtaposed to the N-type MOSFET, and composed of a second high dielectric constant film containing one or more metallic element(s) selected from a group consisting of Hf and Zr; and a second gate electrode, disposed on the second gate insulating film to contact with the second high dielectric constant film, and composed of a polycrystalline silicon film, wherein an average concentration of the metallic element in the second high dielectric constant film is lower than an average concentration of the metallic element in the first high dielectric constant film.

Here, the "concentration of the metallic element in the second high dielectric constant film" indicates an average concentration of the metallic element in the second high dielectric constant film. Further, the "concentration of the metallic element in the first high dielectric constant film" indicates an average concentration of the metallic element in the first high dielectric constant film. The first high dielectric constant film and the second high dielectric constant film may be formed to have same and uniform concentration of the metallic element in the films, respectively, or have different concentrations. For example, the concentration at the interface of the first high dielectric constant film with the polycrystalline silicon film may be set to be same as the concentration at interface of the second high dielectric constant film with the polycrystalline silicon film, and the metal concentration in the first high dielectric constant film may be set to be higher than the metal concentration in the second high dielectric constant film in other regions.

Since the concentration of the metallic element is lower in the formed second high dielectric constant film of the P-type MOSFET in the present invention than the concentration of the metallic element in the first high dielectric constant film in the N-type MOSFET, the diffused quantity of the metal, which has been originally contained in the second high dielectric constant film and is diffused into the polycrystalline silicon film, is reduced, even though the second high dielectric constant film contacts with the polycrystalline silicon film, and thus the generation of the depletion layer in the polycrystalline silicon can be avoided. This can diminish the influence of Fermi level pinning on the P-type MOSFET. Therefore, the increase of the threshold voltage of the P-type MOSFET can be reduced and the fluctuation thereof can also be decreased.

The semiconductor devices according to the above-described aspects of the present invention may further have a configuration, in which a concentration of the metallic element at least at an interface contacting with the polycrystalline silicon film in the second high dielectric constant film is lower than a concentration of the metallic element in other region in the second high dielectric constant film. Having such configuration, the diffusion of the metallic element into the polycrystalline silicon film can be reduced to diminish the influence of Fermi level pinning over the P-type MOSFET, while enjoying the advantageous effect presented by employing the high dielectric constant film.

The semiconductor devices according to the above-described aspects of the present invention may further have a configuration, in which the first gate insulating film of the N-type MOSFET further includes a silicon oxide film provided between the semiconductor substrate and the first high dielectric constant film, and wherein the second gate insulating film of the P-type MOSFET further includes a silicon oxide film provided between the semiconductor substrate and the second high dielectric constant film. The silicon oxide film may additionally contain nitrogen.

Diffusion, migration or the like of the metal element contained in the first high dielectric constant film and the second high dielectric constant film into the semiconductor substrate can be prevented by providing the silicon oxide films between the semiconductor substrate and the first high dielectric constant film and between the semiconductor substrate and the second high dielectric constant film, respectively.

The semiconductor devices according to the above-described aspects of the present invention may further have a configuration, in which, in the first gate electrode of the N-type MOSFET, the polycrystalline silicon film includes an N-type impurity, and wherein, in the second gate electrode of the P-type MOSFET, the polycrystalline silicon film includes a P-type impurity.

Fermi level pinning described above is noticeably caused when the polycrystalline silicon film containing a P-type impurity contacts with the high dielectric constant film. On the contrary, since the concentration of the metallic element is lower in the second high dielectric constant film in the P-type MOSFET, the diffused quantity of the metal element, which is originally contained in the second high dielectric constant film and is diffused into the polycrystalline silicon film, is reduced, even though the second high dielectric constant film contacts with the polycrystalline silicon film, and thus the generation of the depletion layer in the polycrystalline silicon can be avoided.

The semiconductor devices according to the above-described aspects of the present invention may further have a configuration, in which the N-type MOSFET and the P-type MOSFET compose internal circuits of LSI.

According to yet other aspect of the present invention, there is provided a method for manufacturing a semiconductor device including an N-type MOSFET and a P-type MOSFET, comprising: forming on an entire surface of a semiconductor substrate a high dielectric constant film including one or more metallic element (s) selected from a group consisting of Hf and Zr, said semiconductor substrate being provided with a P-well and an N-well that are juxtaposed; covering said high dielectric constant film on said N-well with a protective film; ion-implanting said metallic element into said high dielectric constant film on said P-well through a mask of said protective film to enhance a concentration of said metallic element in said high dielectric constant film on said P-well to a level that is higher than a concentration of said metallic element in said high dielectric constant film on said N-well; forming a polycrystalline silicon film on said high dielectric constant film; and selectively removing said high dielectric constant film and said polycrystalline silicon film to form the films into a shape of a gate electrode.

According to further aspect of the present invention, there is provided a method for manufacturing a semiconductor device including an N-type MOSFET and a P-type MOSFET, comprising: forming on an entire surface of a semiconductor substrate a high dielectric constant film including one or more metallic element(s) selected from a group consisting of Hf and Zr, said semiconductor substrate being provided with a P-well and an N-well that are juxtaposed; covering said high dielectric constant film on said P-well with a protective film; ion-implanting an element except Hf and Zr into said high dielectric constant film on said N-well through a mask of said protective film to enhance a concentration of said metallic element in said high dielectric constant film on said N-well to a level that is lower than a concentration of said metallic element in said high dielectric constant film on said P-well; forming a polycrystalline silicon film on said high dielectric constant film; and selectively removing said high dielectric constant film and said polycrystalline silicon film to form the films into a shape of a gate electrode. Here, the "element except Hf and Zr" may preferably be an element, which is capable of being chemically bonded with such metallic element to provide a prevention of diffusing the metallic element into the polycrystalline silicon film, and Si, Ge or the like, for example, are preferably employed.

The methods for manufacturing the semiconductor devices according to the above-described aspects of the present invention may further have a configuration, in which the method further comprises, before forming high dielectric constant film, forming a silicon oxide film on the entire surface of the semiconductor substrate.

According to yet other aspect of the present invention, there is provided a method for manufacturing a semiconductor device including an N-type MOSFET and a P-type MOSFET, comprising: forming on an entire surface of a semiconductor substrate a low concentration-high dielectric constant film including one or more metallic element (s) selected from a group consisting of Hf and Zr, said semiconductor substrate being provided with a P-well and an N-well that are juxtaposed, said low concentration-high dielectric constant film containing said metallic element with a low concentration; covering said low concentration-high dielectric constant film on said N-well with a protective film; selectively removing said low concentration-high dielectric constant film on said P-well through a mask of said protective film; forming a high concentration-high dielectric constant film on said P-well, said high concentration-high dielectric constant film containing one or more metallic element(s) selected from a group consisting of Hf and Zr, and containing said metallic element with a concentration that is higher than the concentration of said metallic element in said low concentration-high dielectric constant film; forming a polycrystalline silicon film on said low concentration-high dielectric constant film and said high concentration-high dielectric constant film; and selectively removing said low concentration-high dielectric constant film, said high concentration-high dielectric constant film and said polycrystalline silicon film to form the films into a shape of a gate electrode.

The methods for manufacturing the semiconductor devices according to the above-described aspects of the present invention may further have a configuration, in which the method further comprises, before forming low concentration-high dielectric constant film, forming a silicon oxide film on the entire surface of the semiconductor substrate.

According to further aspect of the present invention, there is provided a method for manufacturing a semiconductor device including an N-type MOSFET and a P-type MOSFET, comprising: forming on an entire surface of a semiconductor substrate a high concentration-high dielectric constant film including one or more metallic element (s) selected from a group consisting of Hf and Zr, said semiconductor substrate being provided with a P-well and an N-well that are juxtaposed, said high concentration-high dielectric constant film containing said metallic element with a high concentration; covering said high concentration-high dielectric constant film on said P-well with a protective film; selectively removing said high concentration-high dielectric constant film on said N-well through a mask of said protective film; forming a low concentration-high dielectric constant film on said N-well, said low concentration-high dielectric constant film containing one or more metallic element (s) selected from a group consisting of Hf and Zr, and containing said metallic element with a concentration that is lower than the concentration of said metallic element in said high concentration-high dielectric constant film; forming a polycrystalline silicon film on said low concentration-high dielectric constant film and said high concentration-high dielectric constant film; and selectively removing said low concentration-high dielectric constant film, said high concentration-high dielectric constant film and said polycrystalline silicon film to form the films into a shape of a gate electrode.

The methods for manufacturing the semiconductor devices according to the above-described aspects of the present invention may further have a configuration, in which the method further comprises, before forming high concentration-high dielectric constant film, forming a silicon oxide film on the entire surface of the semiconductor substrate.

According to the present invention, the threshold voltage can be reduced and the MOSFET characteristics can be improved in the semiconductor device comprising the N-type MOSFET and the P-type MOSFET both including the high dielectric constant films.

BRIEF DESCRIPTION OF THE PREFERRED EMBODIMENTS

The above and other objects, advantages and features of the present invention will be more apparent from the following description taken in conjunction with the accompanying drawings, in which:

FIGS. 3E to 3G are cross-sectional views of the semiconductor device having the configuration shown in FIG. 1, illustrating an example of a manufacturing process for the semiconductor device;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

Figure 1:
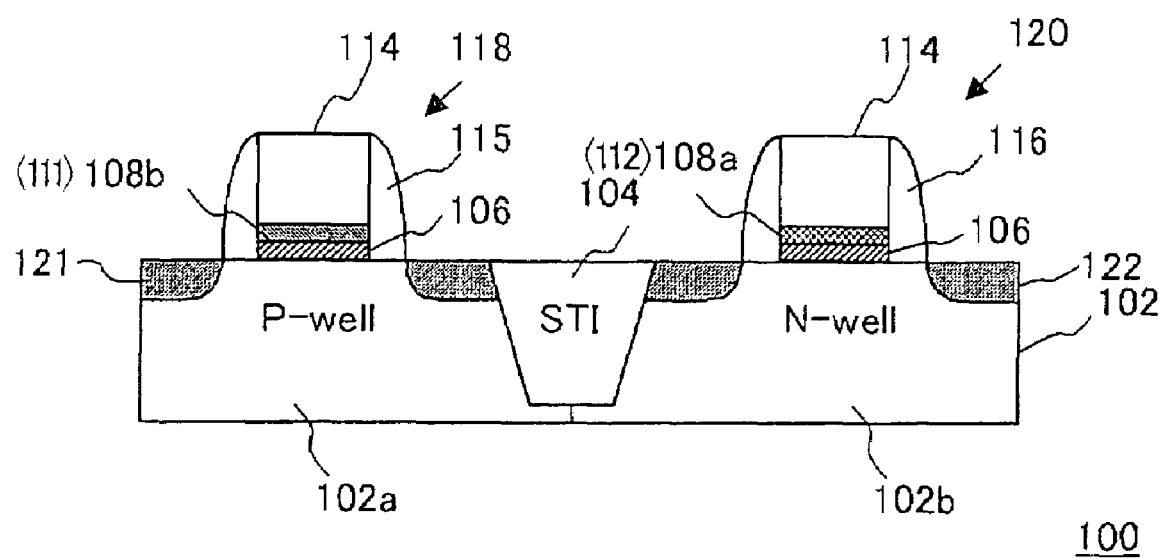
FIG. 1 is a cross-sectional view of a semiconductor device, illustrating an example of a configuration of a semiconductor device in an embodiment of the present invention.

FIG. 1 is a cross-sectional view, illustrating a configuration of a semiconductor device in this embodiment.

In this embodiment, the semiconductor device 100 is a complementary metal oxide semiconductor (CMOS) device including an N-type MOSFET 118 and a P-type MOSFET 120. In addition, this CMOS device constitutes an internal circuit of an LSI.

Semiconductor device 100 comprises a silicon substrate 102, which has a P-well 102a having a P-type conductivity and an N-well 102b having an N-type conductivity provided thereon, and a device separating-region 104 for separating the P-well 102a from the N-well 102b. An N-type MOSFET 118 and a P-type MOSFET 120 are formed in the P-well 102a and the N-well 102b, respectively.

A pair of impurity diffusion regions 121 is provided in the P-well 102a, and a channel region is formed therebetween. On the channel region is provided with a gate, which comprises a gate insulating film having a silicon oxide film 106 and a high concentration-high dielectric constant film 108b formed thereon in this sequence, a gate electrode provided on the gate insulating film and composed of a polycrystalline silicon film 114 and a side wall insulating film 115. Here, the polycrystalline silicon film 114 is disposed so as to contact with the high concentration-high dielectric constant film 108b. The polycrystalline silicon film 114 of the N-type MOSFET 118 is doped with an N-type impurity. The N-type MOSFET 118 is constituted with these components.

Similarly, a pair of impurity diffusion regions 122 is provided in the N-well 102b, and a channel region is formed therebetween. On the channel region is provided with a gate, which comprises a gate insulating film having a silicon oxide film 106 and a low concentration-high dielectric constant film 108a formed thereon in this sequence, a gate electrode provided on the gate insulating film and composed of a polycrystalline silicon film 114 and a side wall insulating film 116. Here, the polycrystalline silicon film 114 is disposed so as to contact with the low concentration-high dielectric constant film 108a. The polycrystalline silicon film 114 of the P-type MOSFET 120 is doped with a P-type impurity. The P-type MOSFET 120 is constituted with these components.

The high concentration-high dielectric constant film 108b and the low concentration-high dielectric constant film 108a are films having higher relative dielectric constant than silicon oxide, and so-called high-k film may be employed for these films. The high concentration-high dielectric constant film 108b and the low concentration-high dielectric constant film 108a may be composed of a material having a relative dielectric constant of equal to or higher than 10. More specifically, the high concentration-high dielectric constant film 108b and the low concentration-high dielectric constant film 108a may be respectively composed of a material containing one or more element selected from a group consisting of Hf and Zr, and the available films may typically be an oxide film, a silicate film or the like containing any of the above-described elements. The use of such materials increases the relative dielectric constants of the high concentration-high dielectric constant film 108b and the low concentration-high dielectric constant film 108a, while providing improved heat resistances. This feature can contribute a miniaturization and an improvement on the reliability of the MOSFET.

The high concentration-high dielectric constant film 108b and the low concentration-high dielectric constant film 108a may be composed of the same material, or may be composed of different materials.

The first high dielectric constant film 111 and the second high dielectric constant film 112 may be composed of a material containing Hf and Si. In such case, the content ratio of Hf over the total content of Hf and Si can be equal to or higher than 20 atomic %. In addition, the first high dielectric constant film 111 and the second high dielectric constant film 112 may be respectively and independently composed of HfSiO or HfAlO, or nitride thereof. In such case, a lower limit of the percentage of Hf for the total content of Hf and Al in HfAlO may be equal to or higher than 20 atomic %. Further, the semiconductor devices may have a configuration, in which the first high dielectric constant film and the second high dielectric constant film are free of Al.

As described above, when the polycrystalline silicon film is formed so as to contact with the high dielectric constant film, the metallic element such as Hf or Zr in the high dielectric constant film is diffused into the polycrystalline silicon film, and this, in turn, creates a depletion layer at the interface of the polycrystalline silicon film with the high dielectric constant film. This generates Fermi level pinning, and thus a problem is particularly arisen, in which the threshold voltage of the P-type MOSFET is increased. In this embodiment, an average concentration of the metallic element such as Hf and Zr (hereinafter merely referred to as "diffusion element") in the low concentration-high dielectric constant film 108a of the P-type MOSFET 120 is lower than an average concentration of the diffusion element in the high concentration-high dielectric constant film 108b of the N-type MOSFET 118.

The average concentration of the metallic element in the high concentration-high dielectric constant film 108b of the N-type MOSFET 118 may be, for example, 40 atomic %. This can enhance the dielectric constant of the N-type MOSFET 118, thereby improving the MOSFET characteristics. The average concentration thereof in the low concentration-high dielectric constant film 108a of the P-type MOSFET 120 may be, for example, 20 atomic %. This can diminish the influence of Fermi level pinning.

When the materials containing the above-described diffusion elements are employed for the materials composing the high concentration-high dielectric constant film 108b and the low concentration-high dielectric constant film 108a, a problem of increasing the threshold voltage may be occurred due to the influence of Fermi level pinning on the P-type MOSFET 120. However, since the concentration of the diffusion elements in the low concentration-high dielectric constant film 108a of the P-type MOSFET 120 is lower according to the configuration of the semiconductor device 100 in the present embodiment, this can diminish the influence of Fermi level pinning. On the other hand, since the concentration of the diffusion elements in the high concentration-high dielectric constant film 108b of the N-type MOSFET 118 is higher, the dielectric constant of the high concentration-high dielectric constant film 108b can be increased, thereby providing improved MOSFET characteristics.

FIGS. 2A to 2D and FIGS. 3E to 3G are cross-sectional views, illustrating an example of a manufacturing process for the semiconductor device 100 having the configuration shown in FIG. 1.

Figure 2A:
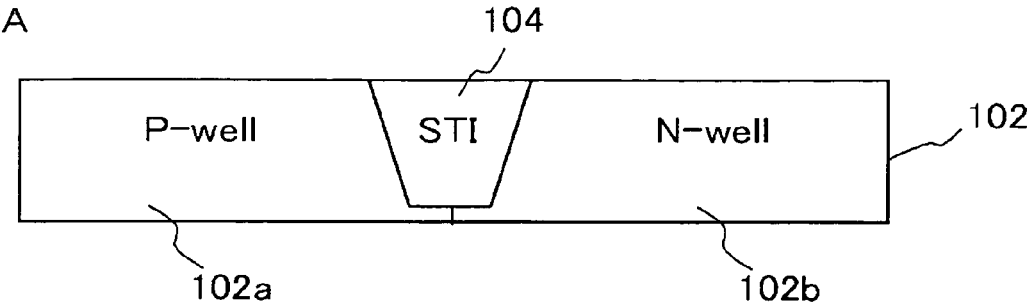
FIGS. 2A to 2D are cross-sectional views of the semiconductor device having the configuration shown in FIG. 1, illustrating an example of a manufacturing process for the semiconductor device.

At first, an element-separating region 104 is formed according to a shallow trench isolation (STI) in the silicon substrate 102 via a known technique, and thereafter, a P-type impurity is ion-implanted to form the P-well 102a and an N-type impurity is ion-implanted to form the N-well 102b, respectively (FIG. 2A). The element-separating region 104 may be formed via other known method such as, for example, local oxidation of silicon (LOCOS) method or the like.

Subsequently, channel regions are formed in the P-well 102a and the N-well 102b, respectively, via a known technique. Here, an N-type impurity and a P-type impurity may be ion-implanted into the lower portions of the channel regions of the P-well 102a and the N-well 102b, respectively, to form punchthrough stop regions. The short-channel effect thereto can be inhibited by forming such punchthrough stop regions.

Figure 2B:
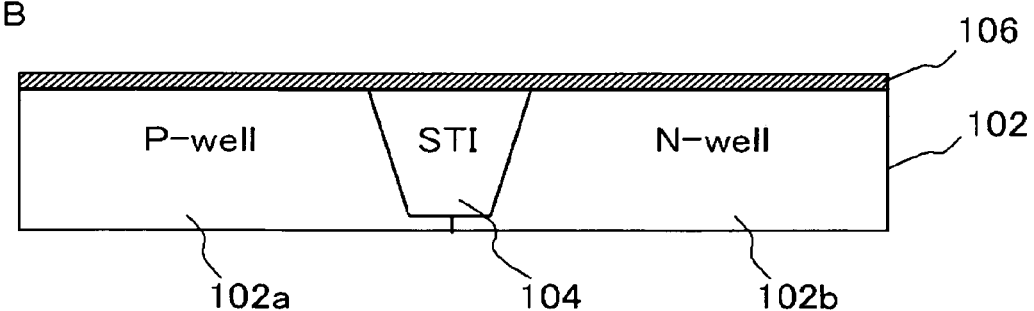

Subsequently, a silicon oxide film 106 (having film thickness of, e.g., about 1 nm to 2 nm) is formed on the surface of the silicon substrate 102 (FIG. 2B). The silicon oxide film 106 may be formed by, for example, conducting a thermal oxidation on the surface of the silicon substrate 102. A condition of thermal oxidation may be, for example, at a processing temperature of 900 degree C. and for a duration time of on the order of from 40 to 50 seconds.

Figure 2C:
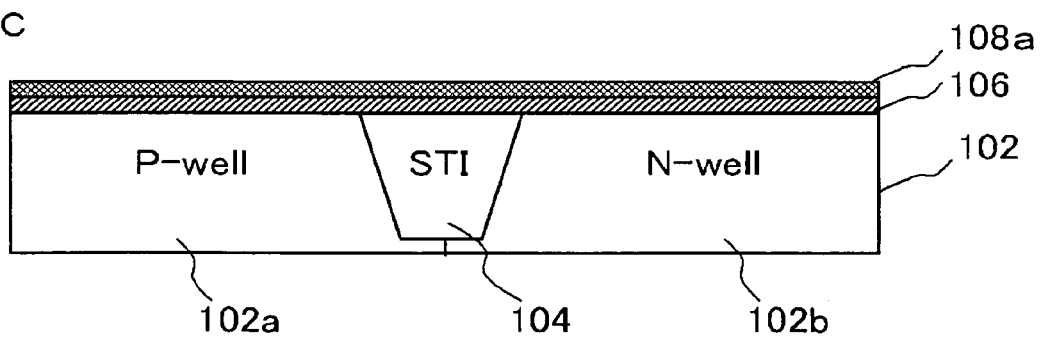

Subsequently, a low concentration-high dielectric constant film 108a (for example, having a film thickness of about 1.5 to 2.5 nm and a diffusion element concentration of about 20 atomic %) is formed on the silicon oxide film 106 (FIG. 2C). The low concentration-high dielectric constant film 108a may be deposited via a chemical vapor deposition (CVD), an atomic layer deposition (ALD) or the like.

Hafnium silicate is employed for depositing the low concentration-high dielectric constant film 108a in the present embodiment. The deposition thereof is conducted by using an organic hafnium source gas, an oxidizing gas and a silicon-containing gas. The concentrations of the diffusion elements in the formed low concentration-high dielectric constant film 108a can be adjusted to a desired value by suitably controlling the flow rates of respective components contained in the deposition gas. Here, oxygen may be employed for the oxidizing gas and monosilane ($SiH_4$) may be employed for the silicon-containing gas, for example.

Figure 2D:
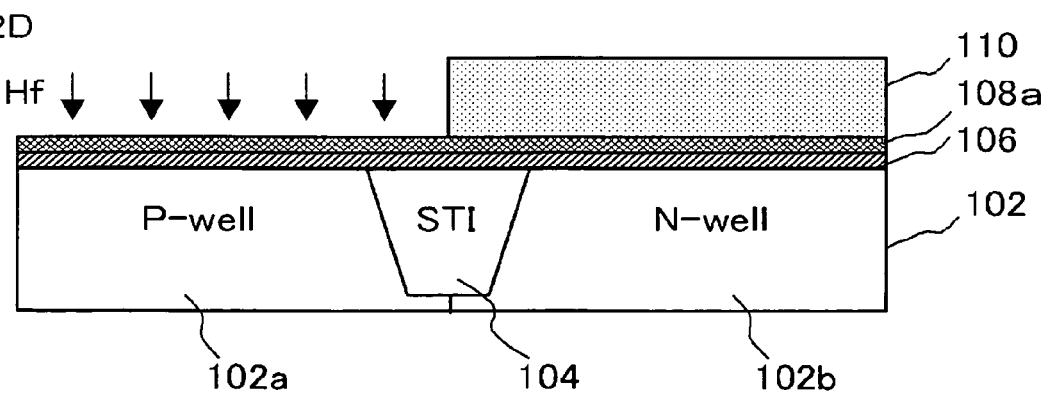

Subsequently, a photo resist 110 is formed on the N-well 102b. The photo resist 110 is formed by applying a resist over the surface of the low concentration-high dielectric constant film 108a and then exposing and developing thereof through a mask for patterning (not shown). Hf ion is implanted into an exposed portion (on the P-well 102a) of the low concentration-high dielectric constant film 108a (FIG. 2D). The implantation process of Hf ion can be conducted under the condition of, for example, 0.1 keV and $4 \times 10^{14}$ $cm^{-2}$ to $6 \times 10^{14}$ $cm^{-2}$.

This converts the low concentration-high dielectric constant film 108a on the P-well 102a into the high concentration-high dielectric constant film 108b having higher diffusion element concentration (diffusion element concentration of not less than about 40 atomic %). Subsequently, the photo resist 110 is stripped under a dry atmosphere employing ozone, for example, so as to avoid the simultaneous unwanted stripping of the high concentration-high dielectric constant film 108b and the low concentration-high dielectric constant film 108a (FIG. 3E).

Thereafter, an annealing is carried out by using, for example, a nitrogen-containing gas such as ammonia, nitrogen and the like. The processing condition of the nitrogen annealing may be, for example, at a process temperature of 900 to 1,000 degree C. and for a duration time of 40 seconds or the like, when ammonia, for example, is employed. An unwanted crystallization of hafnium silicate can be prevented by conducting the annealing process.

Thereafter, the polycrystalline silicon film 114 is formed on the high concentration-high dielectric constant film 108b and the low concentration-high dielectric constant film 108a (FIG. 3F). Then, an N-type impurity is ion-implanted into the polycrystalline silicon film 114 deposited on the P-well 102a, and a P-type impurity is ion-implanted into the polycrystalline silicon film 114 deposited on the N-well 102b.

Subsequently, the silicon oxide film 106, the high concentration-high dielectric constant film 108b, the low concentration-high dielectric constant film 108a and the polycrystalline silicon film 114 are selectively dry-etched to form the shape of the gate electrode (FIG. 3G).

Then, on the P-well 102a, a side wall insulating film 115 is formed to cover the respective side walls of the silicon oxide film 106, the high concentration-high dielectric constant film 108b and the polycrystalline silicon film 114. Similarly, on the N-well 102b, a side wall insulating film 116 is formed to cover the respective side walls of the silicon oxide film 106, the low concentration-high dielectric constant film 108a and the polycrystalline silicon film 114. The side wall insulating film 115 and the side wall insulating film 116 can be formed via an anisotropic etch process by using, for example, a fluorocarbon gas or the like.

Subsequently, source/drain extension regions, which are electrical connecting sections between the channel regions and the impurity diffusion regions described later, are formed on the surfaces of the P-well 102a and the N-well 102b, respectively.

Next, concerning the surface of the P-well 102a, the outer layer of the P-well 102a is doped with an N-type impurity such as P, As and the like through a mask of the gate electrode and the side wall insulating film 115 to form the impurity diffusion region 121. Similarly, concerning the surface of the N-well 102b, the outer layer of the N-well 102b is doped with a P-type impurity such as B, Al and the like through a mask of the gate electrode and the side wall insulating film 116 to form the impurity diffusion region 122. The source region and the drain region are formed according to this procedure. Thereafter, the doped impurities are activated by thermally processing thereof within a non-oxidizing atmosphere. The semiconductor device 100, which is the CMOS device shown in FIG. 1, is formed by the above-mentioned process.

In this embodiment, a quantity of a metal (Hf in this embodiment) being diffused into the polycrystalline silicon film 114 from the low concentration-high dielectric constant film 108a can be reduced for the P-type MOSFET 120, which is vulnerable by Fermi level pinning, by composing the low concentration-high dielectric constant film 108a with an alternative low concentration-high dielectric constant film having lower concentration of the diffusion element, thereby reducing the generation of the depletion layer in the polycrystalline silicon film 114. This can reduce the threshold voltage in the P-type MOSFET.

On the other hand, if the concentration of the diffusion element in the high concentration-high dielectric constant film 108b in the N-type MOSFET 118 is reduced, like the low concentration-high dielectric constant film 108a, the relative dielectric constant of the high concentration-high dielectric constant film 108b is also decreased, and thus better MOSFET characteristics can not be maintained. However, the concentration of the diffusion element in the high concentration-high dielectric constant film 108b of the N-type MOSFET 118 is controlled independently from the low concentration-high dielectric constant film 108a in this embodiment to provide higher concentration than the concentration in the low concentration-high dielectric constant film 108a, and thus the higher dielectric constant of the high concentration-high dielectric constant film 108b of the N-type MOSFET 118 can be maintained to provide better MOSFET characteristics. Since the concentration of the diffusion element in the low concentration-high dielectric constant film 108a is lower according to the present invention as have been described above, the generation of Fermi level pinning in the P-type MOSFET 120 can be prevented, even if the film thicknesses of the high concentration-high dielectric constant film 108b and the low concentration-high dielectric constant film 108a are increased to a level, which provides sufficiently lower gate leakage current that will not cause a problem, thereby stably reducing the threshold voltage of the P-type MOSFET 120.

Second Embodiment

In this embodiment, the semiconductor device 100 has a configuration same as that shown in FIG. 1 in the first embodiment. FIGS. 4A to 4D are cross-sectional views, illustrating an example of a manufacturing process for the semiconductor device 100 according to the present embodiment.

Figure 4A:
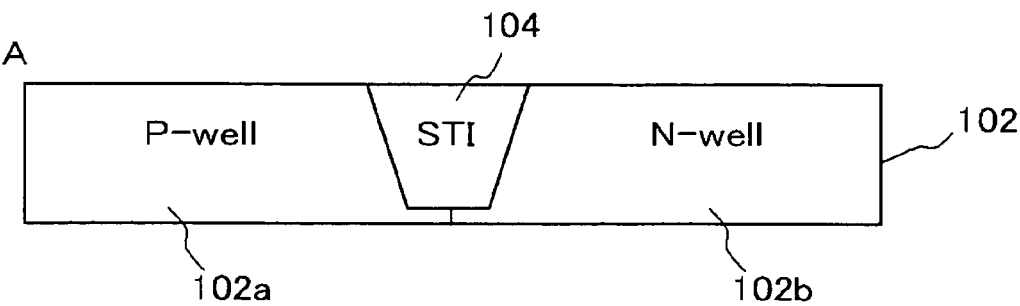
FIGS. 4A to 4D are cross-sectional views of the semiconductor device having the configuration shown in FIG. 1, illustrating another example of a manufacturing process for the semiconductor device.
Figure 4B:
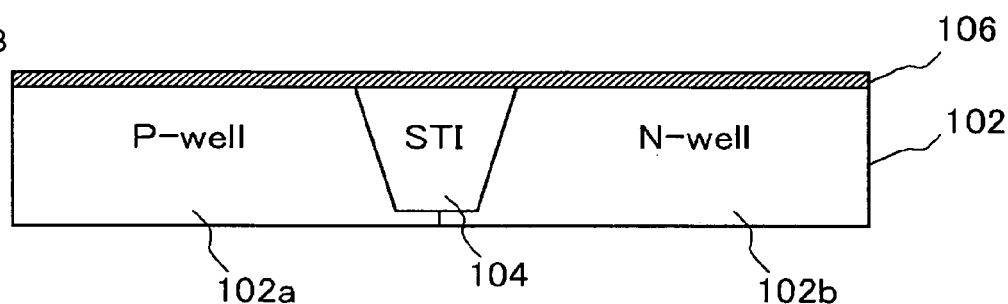

At first, similar processing as described in the first embodiment in reference to FIG. 2A and FIG. 2B is conducted to form a silicon oxide film 106 on a silicon substrate 102 (FIG. 4A and FIG. 4B).

Figure 4C:
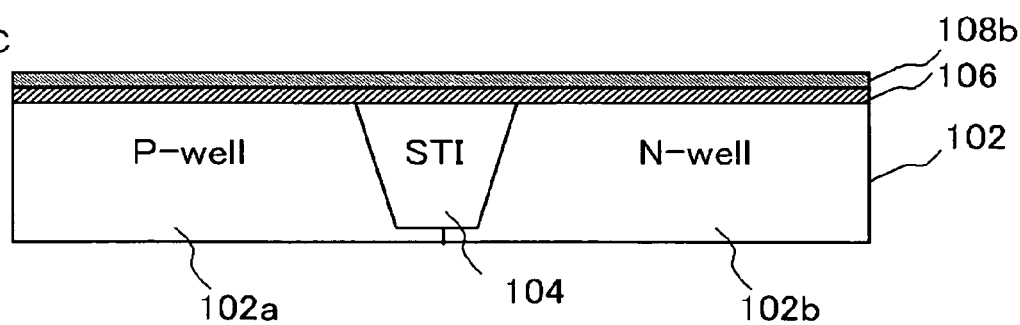
Figure 4D:
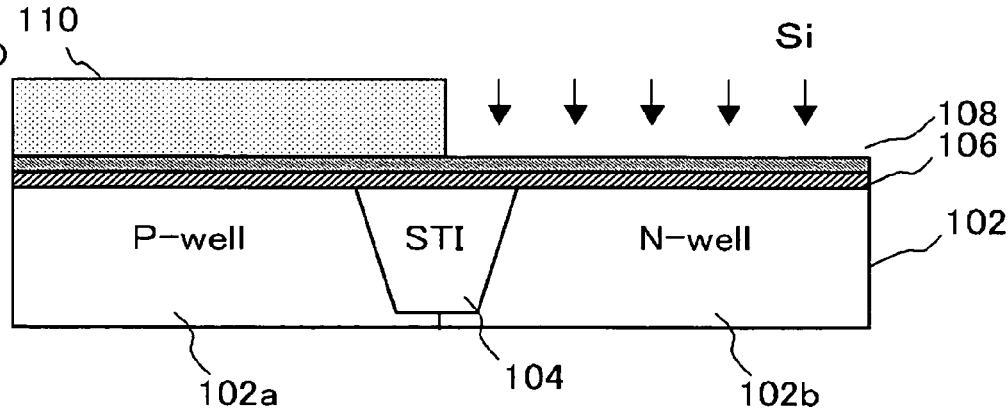

Subsequently, a high concentration-high dielectric constant film 108b having higher concentration of the diffusion element (for example, having a film thickness of about 1.5 to 2.5 nm and a diffusion element concentration of about 40 atomic %) is formed on the silicon oxide film 106 (FIG. 4C). The production process is different in this respect from the production process of the first embodiment for forming the low concentration-high dielectric constant film 108a on the silicon oxide film 106. The high concentration-high dielectric constant film 108b may be deposited via a chemical vapor deposition (CVD), an atomic layer deposition (ALD) or the like, similarly as in the formation of the low concentration-high dielectric constant film 108a in the first embodiment. Hafnium silicate is employed for depositing the high concentration-high dielectric constant film 108b in the present embodiment.

Subsequently, a photo resist 110 is formed on the P-well 102a. The photo resist 110 is formed by applying a resist over the surface of the high concentration-high dielectric constant film 108b and then exposing and developing thereof through a mask for patterning (not shown). Si ion is implanted into an exposed portion (on the N-well 102b) of the high concentration-high dielectric constant film 108b. The implantation process of Si ion can be conducted under the condition of, for example, 0.1 keV and $5 \times 10^{14}$ cm$^{-2}$ to $7 \times 10^{14}$ cm$^{-2}$.

This converts the high concentration-high dielectric constant film 108b on the N-well 102b into the low concentration-high dielectric constant film 108a having lower diffusion element concentration (diffusion element concentration of not higher than about 20 atomic %). Subsequently, similarly as in the first embodiment, the photo resist 110 is stripped under a dry atmosphere employing ozone, for example, so as to avoid the simultaneous unwanted stripping of the high concentration-high dielectric constant film 108b and the low concentration-high dielectric constant film 108a (FIG. 3E).

Figure 5:
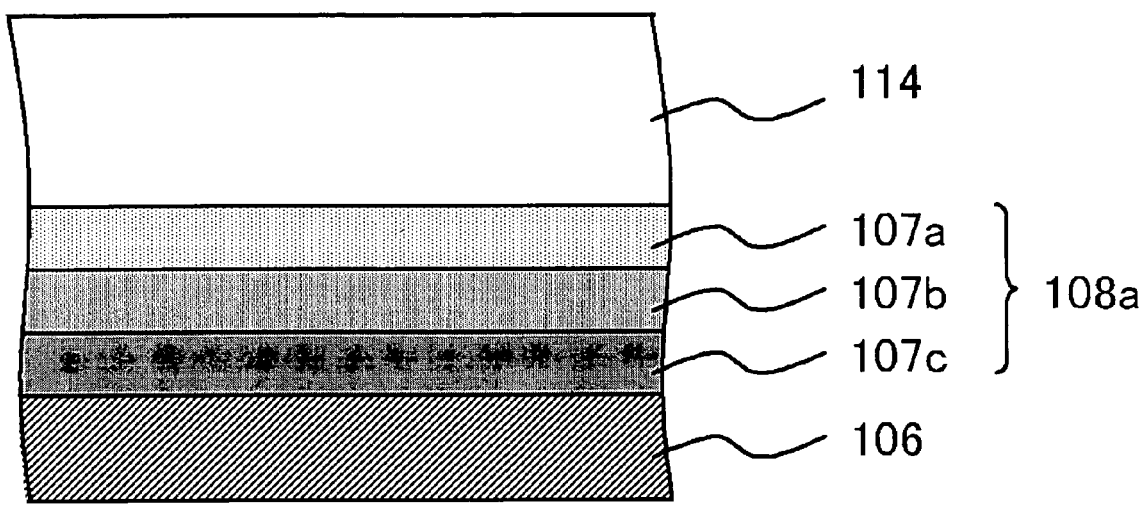
FIG. 5 is a cross-sectional view of the semiconductor device, illustrating an example of a configuration of the low concentration-high dielectric constant film in the P-type MOSFET in detail.

The ion-implantation of Si ion may be conducted for multiple times by selecting different accelerating voltages to provide different implanting depths. For example, larger amount of dose should be employed as the intended implanting depth is shallower, so that the concentration of the diffusion element in the low concentration-high dielectric constant film 108a at the interface with the polycrystalline silicon film 114 can be lower than other regions thereof. FIG. 5 is a cross-sectional view, illustrating an exemplary embodiment having a low concentration-high dielectric constant film 108a, which is suitably formed so that the concentration of the diffusion element at an interface thereof contacting with a silicon oxide film 106 is different from the concentration at an interface thereof contacting with a polycrystalline silicon film 114. Here, the low concentration-high dielectric constant film 108a is composed of a first low concentration-high dielectric constant film region 107a, a second low concentration-high dielectric constant film region 107b and a third low concentration-high dielectric constant film region 107c. Further, concerning the concentrations of the diffusion element in respective region, the first low concentration-high dielectric constant film region 107a has the lowest concentration of the diffusion element, and the concentration is increased in the second low concentration-high dielectric constant film region 107b and further increased in the third low concentration-high dielectric constant film region 107c. Having such configuration, the diffusion of the diffusion element into polycrystalline silicon film 114 can be reduced to diminish the influence of Fermi level pinning over the P-type MOSFET 120, while enjoying the advantageous effect presented by employing the high dielectric constant film.

After that, similar processing as described in the first embodiment in reference to FIGS. 3E to 3G is conducted to obtain the semiconductor device 100 shown in FIG. 1. Advantageous effects similarly as obtained in the first embodiment are also obtained in this embodiment.

Third Embodiment

Figure 6A:
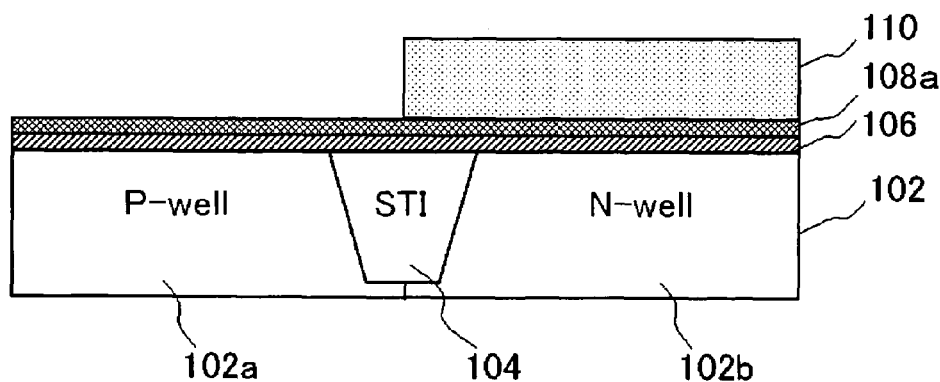
FIGS. 6A to 6C are cross-sectional views of the semiconductor device having the configuration shown in FIG. 1, illustrating another example of a manufacturing process for the semiconductor device.
Figure 6B:
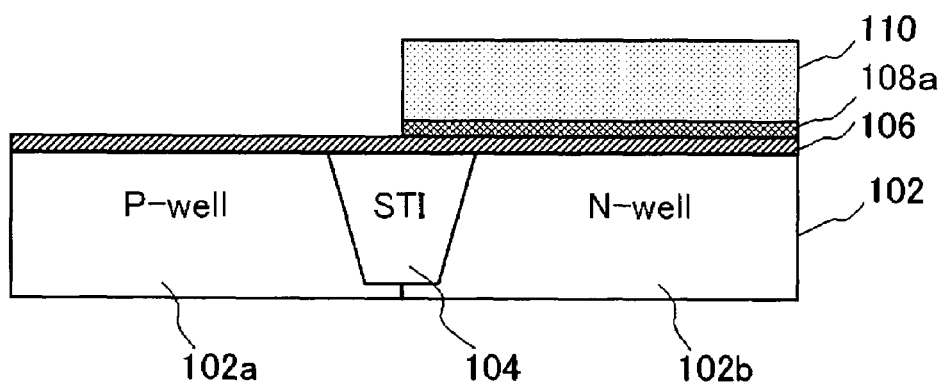
Figure 6C:
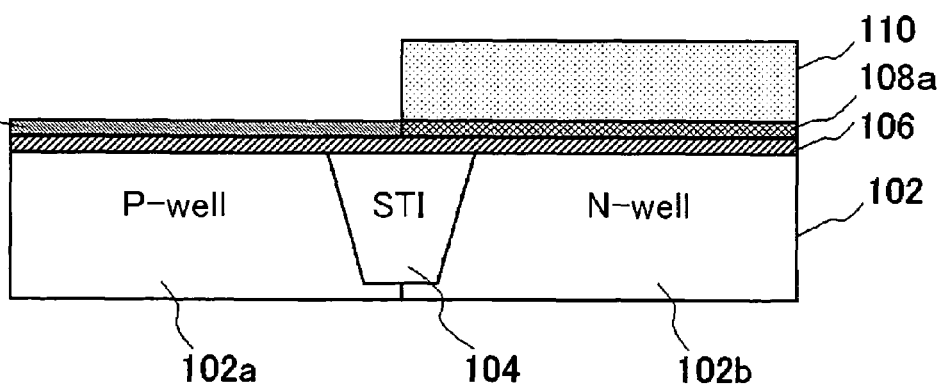

In this embodiment, the semiconductor device 100 has a configuration similar as that shown in FIG. 1 in the first embodiment. FIGS. 6A to 6C are cross-sectional views, illustrating an example of a manufacturing process for the semiconductor device 100 according to the present embodiment.

At first, similar processing as described in the first embodiment in reference to FIG. 2A to FIG. 2C is conducted to form the silicon oxide film 106 and the low concentration-high dielectric constant film 108a on the silicon substrate 102.

Then, a photo resist 110 is formed on a N-well 102b (FIG. 6A). The photo resist 110 is formed by applying a resist over the surface of the low concentration-high dielectric constant film 108a and then exposing and developing thereof through a mask for patterning (not shown). Then, a wet etching is carried out by using, for example, diluted fluorinated acid (DHF). This procedure provides a selective removal of the low concentration-high dielectric constant film 108a on the P-well 102a (FIG. 6B).

Thereafter, a high concentration-high dielectric constant film 108b having higher diffusion element concentration than in the low concentration-high dielectric constant film 108a is formed on the silicon oxide film 106 disposed on P-well 102a (FIG. 6C) Then, the photo resist 110 is stripped under a dry atmosphere employing ozone, for example, so as to avoid the simultaneous unwanted stripping of the low concentration-high dielectric constant film 108a and the high concentration-high dielectric constant film 108b. This provides a configuration, which is similar to that shown in FIG. 3E in the first embodiment. Thereafter, similar processing as described in the first embodiment in reference to FIGS. 3E to 3G is conducted to obtain the semiconductor device 100 shown in FIG. 1. Advantageous effects similar as obtained in the first embodiment are also obtained in this embodiment.

Further, the low concentration-high dielectric constant film 108a may be formed to include multiple sub-layers therein by suitably selecting different concentrations of the diffusion element gas in the deposition gas. This can provide a similar configuration as shown in FIG. 5, thereby presenting similar advantageous effects.

While the above-described present embodiment illustrates the configuration, in which the low concentration-high dielectric constant film 108a is first formed and then is partially removed and thereafter the high concentration-high dielectric constant film 108b is formed thereon, an alternative configuration, in which the high concentration-high dielectric constant film 108b is first formed on the silicon oxide film 106 similarly as described in the second embodiment, may also be employed. After that in the alternative configuration, the high concentration-high dielectric constant film 108b on the N-well 102b may be removed, and the low concentration-high dielectric constant film 108a may further be formed on the removal region. This alternative approach may also provide a semiconductor device 100 similar as shown in FIG. 1.

While the preferred embodiments of the present invention have been described above in reference to the annexed figures, it should be understood that the disclosures above are presented for the purpose of illustrating the present invention, and various configurations other than the above-described configurations can also be adopted.

For example, while the configuration employing the hafnium silicate film as the high dielectric constant film is described in the above-described embodiment, in addition thereto, oxide film of Hf, Zr or the like, silicate film of Hf, Zr or the like, oxynitride film of Hf, Zr or the like can similarly be employed.

Further, the present invention is applicable to an N-type MOSFET and a P-type MOSFET having a gate insulating film containing an element, which may otherwise be diffused into the polycrystalline silicon film as being contacted with the polycrystalline silicon film to possibly cause Fermi level pinning and is not limited to using Hf and Zr.

In the above-described embodiments, the concentration of the diffusion element in the high dielectric constant film such as the low concentration-high dielectric constant film 108a and the high concentration-high dielectric constant film 108b can be measured by, for example, secondary ion mass spectrometry (SIMS).

It is apparent that the present invention is not limited to the above embodiment, that may be modified and changed without departing from the scope and spirit of the invention.

What is claimed is:

1. A semiconductor device, comprising:
   a semiconductor substrate;
   an N-type MOSFET including:
   a first gate insulating film, formed on said semiconductor substrate, and composed of a first high dielectric constant film including one or more metallic element(s) selected from a group consisting of Hf and Zr; and
   a first gate electrode, disposed on said first gate insulating film to contact with said first high dielectric constant film, and composed of a polycrystalline silicon film; and
   a P-type MOSFET including:
   a second gate insulating film, formed on said semiconductor substrate to be juxtaposed to said N-type MOSFET, and composed of a second high dielectric constant film containing one or more metallic element (s) selected from a group consisting of Hf and Zr; and
   a second gate electrode, disposed on said second gate insulating film to contact with said second high dielectric constant film, and composed of a polycrystalline silicon film,
   wherein a concentration of said metallic element in said second high dielectric constant film is lower than a concentration of said metallic element in said first high dielectric constant film.

2. The semiconductor device according to claim 1, wherein a concentration of said metallic element at least at an interface contacting with said polycrystalline silicon film in said second high dielectric constant film is lower than a concentration of said metallic element at an interface contacting with said polycrystalline silicon film in said first high dielectric constant film.

3. The semiconductor device according to claim 2, wherein an average concentration of said metallic element in said second high dielectric constant film is lower than an average concentration of said metallic element in said first high dielectric constant film.

4. The semiconductor device according to claim 2, wherein said first gate insulating film of said N-type MOSFET further includes a silicon oxide film provided between said semiconductor substrate and said first high dielectric constant film, and wherein said second gate insulating film of said P-type MOSFET further includes a silicon oxide film provided between said semiconductor substrate and said second high dielectric constant film.

5. The semiconductor device according to claim 2, wherein, in said first gate electrode of said N-type MOSFET, said polycrystalline silicon film includes an N-type impurity, and wherein, in said second gate electrode of said P-type MOSFET, said polycrystalline silicon film includes a P-type impurity.

6. The semiconductor device according to claim 1, wherein an average concentration of said metallic element in said second high dielectric constant film is lower than an average concentration of said metallic element in said first high dielectric constant film.

7. The semiconductor device according to claim 6, wherein said first gate insulating film of said N-type MOSFET further includes a silicon oxide film provided between said semiconductor substrate and said first high dielectric constant film, and wherein said second gate insulating film of said P-type MOSFET further includes a silicon oxide film provided between said semiconductor substrate and said second high dielectric constant film.

8. The semiconductor device according to claim 6, wherein, in said first gate electrode of said N-type MOSFET, said polycrystalline silicon film includes an N-type impurity, and wherein, in said second gate electrode of said P-type MOSFET, said polycrystalline silicon film includes a P-type impurity.

9. The semiconductor device according to claim 1, wherein said first dielectric constant film is a single layer.

10. The semiconductor device according to claim 1, wherein said second dielectric constant film is a single layer.

* * * * *